(12) United States Patent
Hsiung et al.

(10) Patent No.: US 8,946,771 B2
(45) Date of Patent: Feb. 3, 2015

(54) GALLIUM NITRIDE SEMICONDUCTOR DEVICES AND METHOD MAKING THEREOF

(75) Inventors: Chih-Wen Hsiung, Hsinchu (TW); Jiun-Lei Jerry Yu, Hsinchu County (TW); Fu-Wei Yao, Hsinchu (TW); Chun-Wei Hsu, Taichung (TW); Chen-Ju Yu, Yilan County (TW); Fu-Chih Yang, Kaohsiung County (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 257 days.

(21) Appl. No.: 13/292,487

(22) Filed: Nov. 9, 2011

(65) Prior Publication Data

US 2013/0112986 A1    May 9, 2013

(51) Int. Cl.
*H01L 31/102* (2006.01)
*H01L 29/66* (2006.01)
*H01L 29/778* (2006.01)
*H01L 29/20* (2006.01)

(52) U.S. Cl.
CPC ...... *H01L 29/66462* (2013.01); *H01L 29/7787* (2013.01); *H01L 29/2003* (2013.01)
USPC ................... 257/189; 257/E21.403

(58) Field of Classification Search
USPC ............. 257/192, 392, E21.403, E21.22, 257/E29.091; 438/172, 174
See application file for complete search history.

(56) References Cited

U.S. PATENT DOCUMENTS

| | | | |
|---|---|---|---|
| 2005/0258451 A1* | 11/2005 | Saxler et al. | 257/192 |
| 2007/0018199 A1* | 1/2007 | Sheppard et al. | 257/200 |
| 2009/0072269 A1* | 3/2009 | Suh et al. | 257/136 |
| 2009/0146224 A1* | 6/2009 | Heying et al. | 257/411 |
| 2010/0258841 A1* | 10/2010 | Lidow et al. | 257/192 |
| 2010/0258848 A1* | 10/2010 | Lidow et al. | 257/288 |
| 2010/0258912 A1* | 10/2010 | Beach et al. | 257/615 |
| 2010/0327322 A1* | 12/2010 | Kub et al. | 257/194 |
| 2012/0112202 A1* | 5/2012 | Hwang et al. | 257/76 |

* cited by examiner

*Primary Examiner* — William F Kraig
*Assistant Examiner* — Khaja Ahmad
(74) *Attorney, Agent, or Firm* — Eschweiler & Associates, LLC (57) ABSTRACT

The present disclosure relates to an enhancement mode gallium nitride (GaN) transistor device. The GaN transistor device has an electron supply layer located on top of a GaN layer. An etch stop layer (e.g., AlN) is disposed above the electron supply layer. A gate structure is formed on top of the etch stop layer, such that the bottom surface of the gate structure is located vertically above the etch stop layer. The position of etch stop layer in the GaN transistor device stack allows it to both enhance gate definition during processing (e.g., selective etching of the gate structure located on top of the AlN layer) and to act as a gate insulator that reduces gate leakage of the GaN transistor device.

17 Claims, 7 Drawing Sheets

GALLIUM NITRIDE SEMICONDUCTOR DEVICES AND METHOD MAKING THEREOF

BACKGROUND

Silicon based semiconductor devices have been a standard of the integrated chip industry for the past three decades. However, in recent years semiconductor devices based on alternative semiconductor materials, which offer advantages over traditional silicon based devices, have started to become manufacturable. Gallium Nitride (GaN) semiconductor devices are one such type of device that has emerged as an attractive alternative to silicon based devices in many areas.

GaN semiconductor devices have already found widespread use in optoelectric applications (e.g., in light emitting diodes) due to the wide band gap of GaN. GaN devices also offer a potential advantage for use in solar cells (e.g., where GaN semiconductor devices cover a wide range of solar photons) and in high power applications (e.g., where the high electron mobility and low temperature coefficients of GaN allow into carry large currents and support high voltages).

SUMMARY

The following presents a simplified summary in order to provide a basic understanding of one or more aspects of the disclosure. This summary is not an extensive overview of the disclosure, and is neither intended to identify key or critical elements of the disclosure, nor to delineate the scope thereof. Rather, the primary purpose of the summary is to present some concepts of the disclosure in a simplified form as a prelude to the more detailed description that is presented later.

In one embodiment, the present disclosure relates to an enhancement mode gallium nitride (GaN) transistor device. The GaN transistor device has a gallium nitride (GaN) layer located on a substrate. An electron supply layer is located on top of the GaN layer, wherein the electron supply layer and the GaN layer share an interface that forms a hetero-junction therebetween. An etch stop layer is located above the electron supply layer. A gate structure is located on top of the etch stop layer, so that the etch stop layer is disposed between the electron supply layer and the gate structure.

In another embodiment, the present disclosure relates to a method for forming an enhancement mode GaN transistor device. The method comprises forming a gallium nitride (GaN) layer on a substrate. An electron supply layer is formed on top of the GaN layer. An etch stop layer is formed above the electron supply layer. A gate structure is formed on top of the etch stop layer, so that the etch stop layer is disposed between the electron supply layer and the gate structure.

In another embodiment, the present disclosure relates to a method for forming an enhancement mode GaN transistor device. The method comprises forming an unintentionally doped gallium nitride (UID-GaN) layer on a substrate. An aluminum gallium nitride (AlGaN) electron supply layer is formed on top of the UID-GaN layer. An aluminum nitride (AlN) etch stop layer is formed above the AlGaN electron supply layer. A gallium nitride (GaN) layer having a p-type doping is formed on top of the AlN etch stop layer. A gate metal is deposited on top of the GaN layer having a p-type doping. A patterned photoresist layer is formed on top of the gate material to define a gate structure. The GaN layer having a p-type doping and the gate metal are selectively etched according to the patterned photoresist layer to define a gate structure in direct contact with the AlN etch stop layer.

The following description and annexed drawings set forth in detail certain illustrative aspects and implementations of the disclosure. These are indicative of but a few of the various ways in which the principles of the disclosure may be employed.

BRIEF DESCRIPTION OF THE DRAWINGS

FIGS. 4-9a and 10 are cross-sectional views of some embodiments of an example semiconductor substrate upon which a method of forming an enhancement mode GaN transistor device is performed.

DETAILED DESCRIPTION

The description herein is made with reference to the drawings, wherein like reference numerals are generally utilized to refer to like elements throughout, and wherein the various structures are not necessarily drawn to scale. In the following description, for purposes of explanation, numerous specific details are set forth in order to facilitate understanding. It may be evident, however, to one skilled in the art, that one or more aspects described herein may be practiced with a lesser degree of these specific details. In other instances, known structures and devices are shown in block diagram form to facilitate understanding.

A typical GaN transistor device comprises a thin layer of aluminum gallium nitride (AlGaN) located above a GaN layer. Under proper condition, a two-dimensional electron gas (2-DEG) is formed at the interface of the GaN and AlGaN layers. In the 2-DEG, some electrons are not bound to an atom, but are instead free to move, providing for a higher mobility of the transistor as compared with other type transistors. To control flow of carriers from a source to a drain, a gate can either be formed directly on top of the AlGaN layer (i.e., in direct contact with the top surface of the AlGaN layer) or recessed into the AlGaN layer (e.g., to improve the range of the drain source voltage).

One of the most common GaN based transistor devices are enhancement mode devices, which operate similar to silicon MOSFET devices by being normally in a non-conducting state (normally off). A typical enhancement mode GaN transistor device comprises a p-type doped cap layer above aluminum gallium nitride (AlGaN) on a gate structure region before a metal layer is formed on the p-type doped cap layer and is designed for bias voltage. However, there are challenges to forming an enhancement mode GaN transistor device (e.g., the gate structure in the enhancement mode transistor may suffer insufficient etching selectivity during gate structure region definition and large gate leakage when the transistor is turned on). Accordingly, a structure for an enhancement mode GaN transistor with improved etching selectivity and reduced gate leakage is disclosed.

Some aspects of the present disclosure provide for an enhancement mode gallium nitride (GaN) transistor device. The GaN transistor device comprises an electron supply layer located on top of a GaN layer. An etch stop layer (e.g., AlN), preferably in-situ deposited after the electron supply layer is formed, is disposed above the electron supply layer. A gate structure is formed on top of the in-situ deposited etch stop layer, such that the bottom surface of the gate structure is located vertically above the etch stop layer. The position of in-situ deposited etch stop layer in the GaN transistor device stack allows it to both enhance gate definition during processing (e.g., during selective etching of the gate structure located on top of the AlN layer) and to act as a gate insulator that reduces gate leakage of the GaN transistor device.

Figure 1:
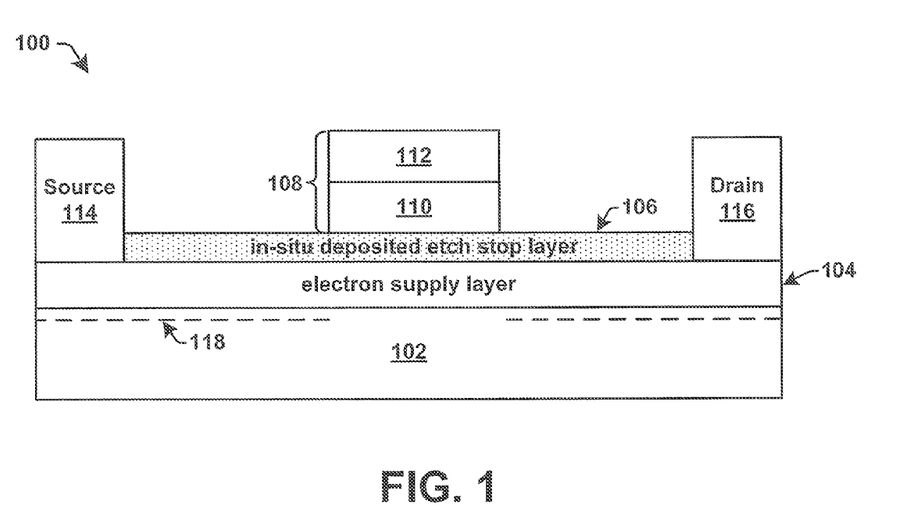
FIG. 1 illustrates a cross sectional view of a first embodiment of an enhancement mode Gallium nitride (GaN) transistor device.

FIG. 1 illustrates a cross sectional view of a first embodiment of an enhancement mode gallium nitride (GaN) (i.e., normally off) transistor device 100. The GaN transistor device 100 comprises an etch stop layer 106 located below the gate structure 108 of the device that both improves device performance and enables improvement in process control ability of the device.

As illustrated in FIG. 1, the transistor device 100 comprises a gallium nitride (GaN) layer 102, which may be located on an underlying substrate (e.g., a sapphire substrate, a silicon substrate, silicon carbide substrate, etc.). The GaN layer may comprise an doped GaN (UID-GaN) layer, usually referred as unintentionally doped (e.g., a GaN material not having intentionally placed dopants, but rather having a doping resulting from process contaminants, for example). In one embodiment, the UID-GaN layer may have an n-type doping.

An electron supply layer 104 is located directly on top of the GaN layer 102, such that the top surface of the GaN layer 102 and the bottom surface of the electron supply layer 104 abut each other. The electron supply layer 104 comprises a material having a band gap unequal to (e.g., larger than) that of the underlying GaN layer 102 so that a heterojunction, which serves as the GaN transistor device channel, is formed at the interface of the GaN layer 102 and electron supply layer 104. The heterojunction causes the electron supply layer 104 to supply electrons to a two-dimensional electron gas (2-DEG) 118 located along the interface between the GaN layer 102 and the electron supply layer 104. The 2-DEG has high mobility electrons that are not bound to any atom, but that are free to move between the source and drain terminals of the GaN transistor device. In one embodiment, the electron supply layer 104 comprises a thin film of aluminum gallium nitride (AlGaN) having a band gap that is larger than the band gap of the underlying GaN layer 102 (e.g., AlGaN has a band gap of approximately 4 eV, while GaN has a band gap of approximately 3.4 eV). In one embodiment, the thin film of AlGaN may be intentionally doped to have an n-type doping that provides carriers to the 2-DEG.

An etch stop layer 106 is located on top of the electron supply layer 104. In an embodiment, the etch stop layer 106 comprises an in-situ deposited etch stop layer formed after the electron supply layer 104. The use of an in-situ deposited etch stop layer ensures good interface quality between the etch stop layer 106 and the electron supply layer 104 and good process control. In some embodiments, the etch stop layer 106 is in a range from about 1 nm thickness to about 20 nm thickness. In one embodiment, illustrated in FIG. 1, the bottom surface of the etch stop layer 106 abuts the top surface of the electron supply layer 104 in at least the gate region of the device.

The etch stop layer 106 may be chosen to have a material composition that offers a wide range of processing and performance advantages to the GaN transistor device. For example, the etch stop layer 106 material has a high etching selectivity with respect to a gate structure 108 (e.g., the etch stop layer has a greater etching selectivity than the electron supply layer with respect to etching of the gate structure). The high etching selectivity provides for good gate definition during processing of the device. In one embodiment, the etch stop layer 106 may also have a dielectric constant that allows the etch stop layer to operate as a gate insulator for the GaN transistor device. The presence of the etch stop layer 106 between the gate structure 108 and the electron supply layer 104 provides for a GaN transistor device comprising a metal insulator semiconductor high electron mobility transistor (MIS-HEMT). In such an embodiment, the etch stop layer 106 may have a band gap that is larger than the band gap of the abutting electron supply layer 104. The higher band gap provides a higher barrier height in the gate region, which gives the device a lower gate leakage.

In one particular embodiment, the etch stop layer 106 comprises aluminum nitride (AlN). In some embodiments, the etch stop layer 106 has a thickness in a range from about 1 nm thickness to about 20 nm thickness. In alternative non-limiting embodiments, the etch stop layer 106 may comprise Silicon nitride ($Si_3N_4$), Indium Nitride (InN), Aluminum Oxide ($Al_2O_3$), or Gallium Oxide (GaO).

A gate structure 108 is located above the etch stop layer 106. The etch stop layer 106 extends below the entire width of the gate structure 108 (e.g., between the source and drain of the device). In one embodiment, the gate structure 108 is disposed to be in direct contact with the etch stop layer 106, such that the bottom surface of the gate structure 108 abuts the top surface of the etch stop layer 106.

The gate structure 108 may comprise a stacked gate structure comprising a group III-V semiconductor material 110 and a gate material 112. The group III-V semiconductor material 110 may be located in direct contact with the etch stop layer 106 (i.e., the gate structure 108 sits directly on top of the etch stop layer 106). The gate material 112 is located on top of the group III-V semiconductor material 110.

In one embodiment, the group III-V semiconductor material 110 comprises gallium nitride (GaN) having a first doping type (e.g., a p-type doping). In some alternative embodiments, the group III-V semiconductor material comprises a p-type doped aluminum gallium nitride (AlGaN) or indium gallium nitride (InGaN), for example. In one embodiment, the gate material 112 may comprise titanium (Ti). In another embodiment, the gate material 112 may comprise one or more of, nickel, aluminum, or gold, for example.

A source terminal 114 is located at one end of the GaN device's conductive channel and a drain terminal 116 is located at the other end of the channel. During operation the enhancement mode GaN transistor device 100 is turned off unless a voltage (e.g., a positive voltage) is applied to the gate structure 108 to drive carriers in the 2-DEG between the source terminal 114 and the drain terminal 116.

One or ordinary skill in the art will appreciate that the gate leakage current of an enhancement mode GaN device (e.g., corresponding to the enhancement mode GaN transistor device 100) can be reduced by increasing the barrier height in the gate region. For example, an increased barrier height prevents thermally or photonically generated electrons from passing through the gate region. Since a band gap is the energy gap between the valence band and the conduction band, a low band gap increases the possibility of thermally or photonically generated electrons being excited to the conduction band, which contributes to an increased leakage current, while a large band gap reduces the possibility of thermally or photonically generated electrons being excited to the conduction band. Therefore, a large band gap of the etch stop layer (e.g., a band gap larger than that of the p-type III-V semiconductor material and the AlGaN) increases the barrier height of the gate and reduces the possibility of electrons contributing to leakage current.

Figure 2A:
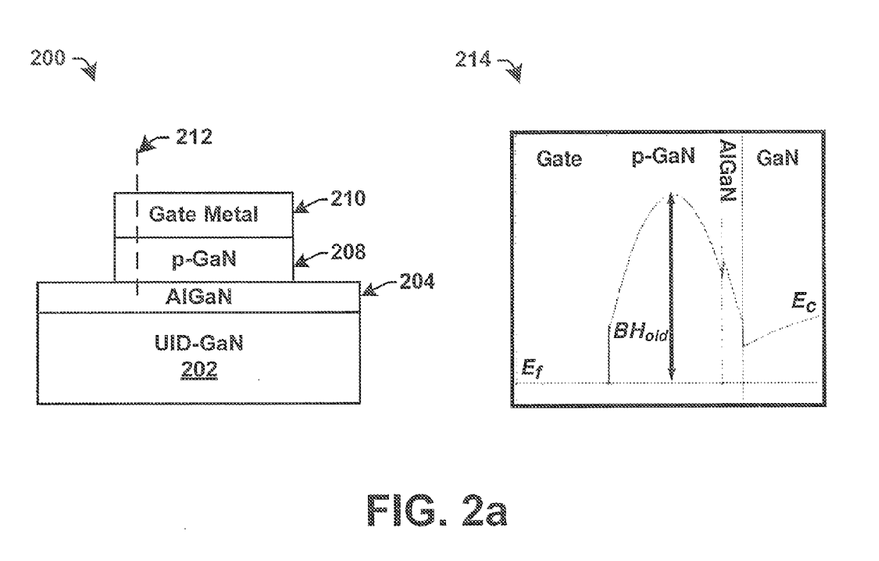
FIG. 2a show a cross section of an embodiment of a GaN transistor device without an aluminum nitride (AlN) etch stop layer, and a corresponding graph of a band gap diagram along the GaN transistor device.

FIG. 2a show a graph 214 of a band gap diagram along a cross section 212 of an embodiment of a GaN device 200 that does not have an AlN etch stop layer (i.e., that has a p-type GaN layer 208 located directly on top of the AlGaN electron supply layer 204). In particular, the enhancement mode GaN device 200 comprises a UID-GaN layer 202, a AlGaN electron supply layer 204 located on top of the UID-GaN layer 202, a p-type GaN layer 208 located on top of the AlGaN electron supply layer 204, and a titanium gate metal 210 located on top of the p-type GaN layer 208. Graph 214 illustrates the band gap diagram corresponding to cross section 212.

Referring to graph 214, without the presence of p-type GaN, the conductance band $E_c$ would be lower at the surface between AlGaN and GaN (UID-GaN), such that the conductance band $E_c$ might be lower than Fermi level $E_f$ constituting a normally-on channel. However, with the presence of p-type GaN, the conductance band $E_c$ is elevated so that even at the surface between AlGaN and GaN (UID-GaN) the conductance band $E_c$ is higher than Fermi level $E_f$ therefore constituting a normally-off channel. The graph 214 also shows that the p-type GaN layer provides for a barrier height of $BH_{old}$ between the gate metal and the AlGaN layer 204.

Figure 2B:
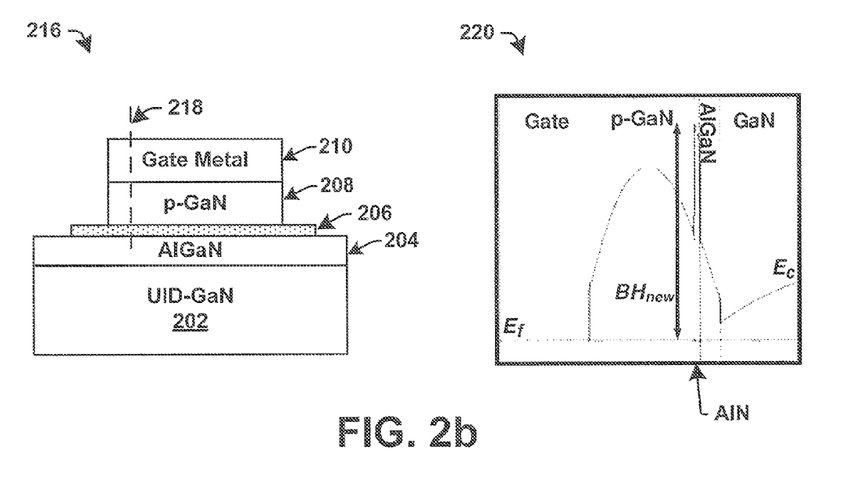
FIG. 2b shows a cross sectional view of an embodiment of a GaN transistor device having an AlN etch stop layer, and a corresponding graph of a band gap diagram along the GaN transistor device.

FIG. 2b show a graph 220 of a band gap diagram along a cross section 218 of an embodiment of a GaN device 216 having an AlN etch stop layer 206 located between a p-type GaN layer 208 and the AlGaN electron supply layer 204. In particular, the enhancement mode GaN device 216 comprises a UID-GaN layer 202, a AlGaN electron supply layer 204 located on top of the UID-GaN layer 202, an AlN etch stop layer 206 located on top of the AlGaN electron supply layer 204, a p-type GaN layer 208 located on top of the AlN etch stop layer 206, and a titanium gate metal 210 located on top of the p-type GaN layer 208. Since the etch stop layer 206 has a larger band gap than the p-type GaN layer (the AlN etch stop layer 206 has a band gap of 6.14 eV and the p-type GaN layer has a band gap of 3.42 eV), it increases the higher barrier height between the gate and the AlGaN layer. As illustrated by graph 220, the AlN etch stop layer provides for a barrier height of $BH_{new}$, wherein $BH_{new}$ is greater than $BH_{old}$. The increase in barrier height provides for a larger potential barrier at the gate of the device, which reduces leakage current.

Figure 3:
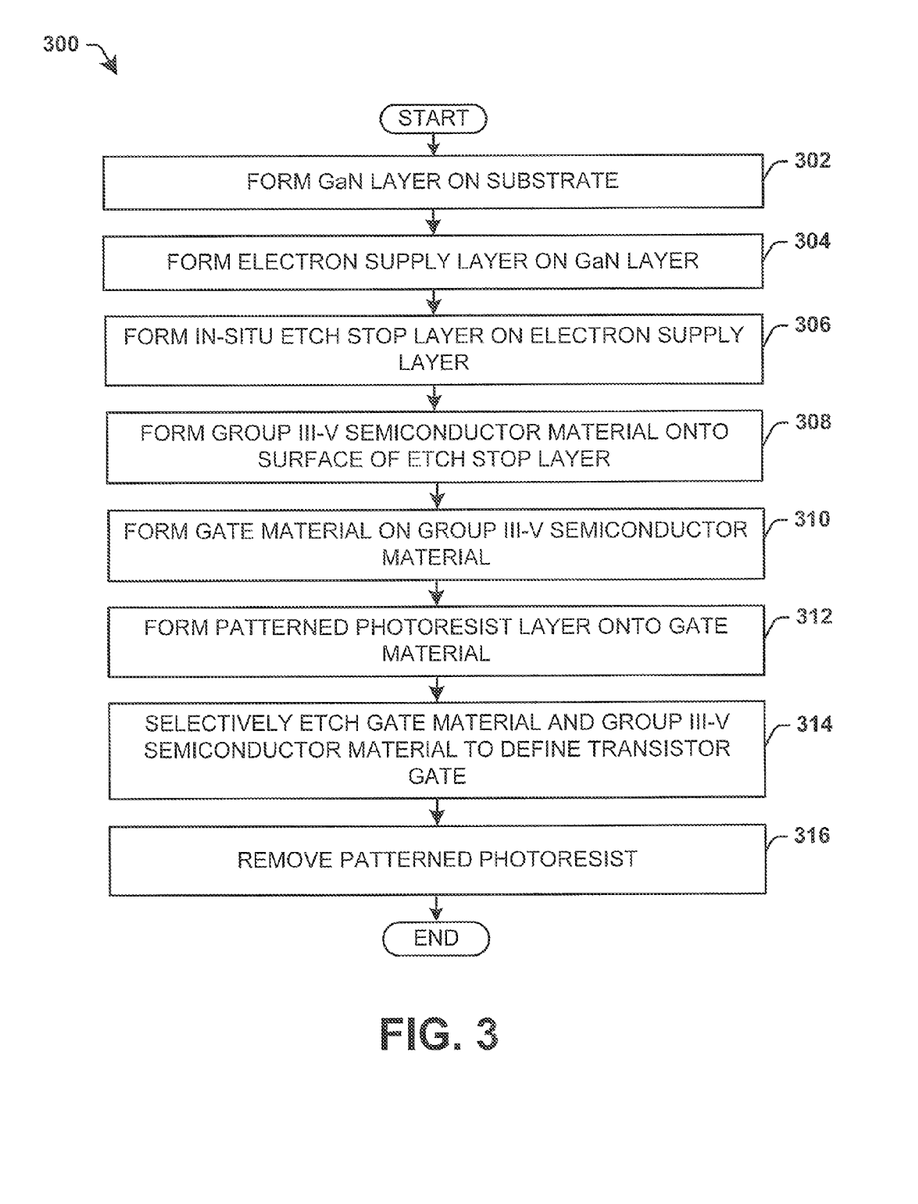
FIG. 3 is a flow diagram illustrating an embodiment of an exemplary method for forming an enhancement mode GaN transistor device.
Figure 4:
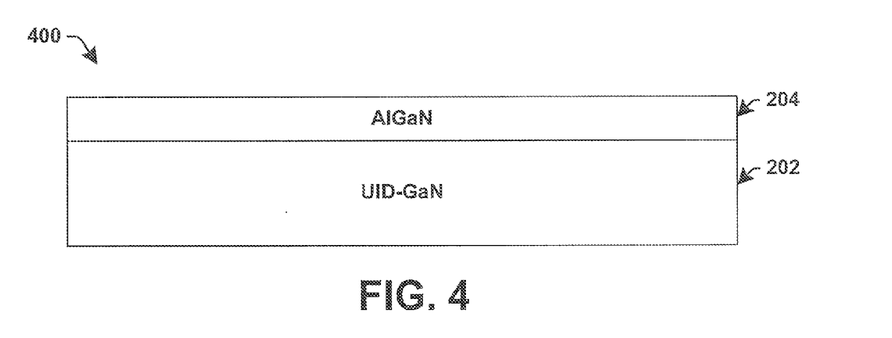

FIG. 3 illustrates a flow diagram of some embodiments of a method 300 for forming an enhancement mode GaN transistor device. Some embodiments of an exemplary semiconductor substrate whereon such a methodology is implemented is illustrated in cross-sectional view in FIGS. 4-9a and 10.

At 302 a GaN layer is formed on top of a substrate (e.g., Silicon, SiC, sapphire). In one embodiment, the GaN layer comprises an unintentionally doped (UID-GaN) layer grown epitaxially onto the substrate (e.g., by chemical vapor deposition (CVD), molecular beam epitaxy (MBE), etc.). The GaN may be grown to a thickness on the order of microns (e.g., of approximately 2 microns).

At 304 an electron supply layer is formed on top of the GaN layer. In one embodiment, the electron supply layer comprises an AlGaN layer is formed on top of the UID-GaN layer. The AlGaN and the UID-GaN form a heterojunction that results in a 2-dimensional electron gas (2-DEG) at the interface of the UID-GaN layer and the AlGaN layer. As illustrated in the cross sectional view 400 of FIG. 4, in some embodiments, an AlGaN electron supply layer 204 is formed directly on top of the UID-GaN layer 202.

At 306 an etch stop layer is formed onto the electron supply layer. In some embodiments, the etch stop layer is formed in a range from about 1 nm thickness to about 20 nm thickness. In one embodiment, the etch stop layer may be formed using sputtering, vapor deposition, chemical vapor deposition (CVD), plasma enhanced chemical vapor deposition (PECVD), or a similar method. In various embodiments, the etch stop layer may comprise a material having a high etching selectivity with respect to an overlying GaN layer, such as AlN, $Si_3N_4$, InN, $Al_2O_3$, or GaO, for example. In one embodiment, the etch stop layer can be in-situ deposited after the electron supply layer is formed. In another embodiment, the etch stop layer may be formed in-situ with the previous AlGaN layer in the same process chamber or with the same process tool. In-situ deposited etch stop layer ensures good interface quality between the etch stop layer and the electron supply layer and good process control.

Figure 5:
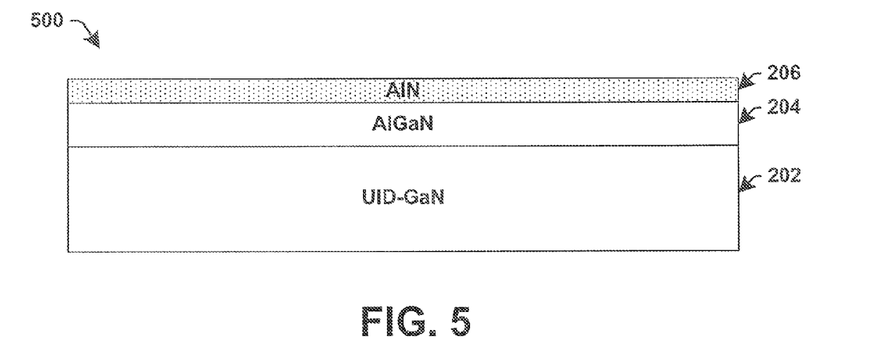

As illustrated in the cross sectional view 500 of FIG. 5, in some embodiments, an etch stop layer comprising an AlN etch stop layer 206 is formed directly on top of the AlGaN electron supply layer 204.

At 308 a semiconductor material is formed on the surface of the stop layer. In one embodiment, the semiconductor material comprises a group III-V semiconductor material having a p-type doping. The semiconductor material may be formed on the etch stop layer in a range from about 1 nm thickness to about 100 nm thickness. In various embodiments the group III-V semiconductor material may comprise GaN, AlGaN, or InGaN and may be doped with a p-type dopant such as magnesium (Mg), calcium (Ca), zinc (Zn), beryllium (Be), or carbon (C), for example.

Figure 6:
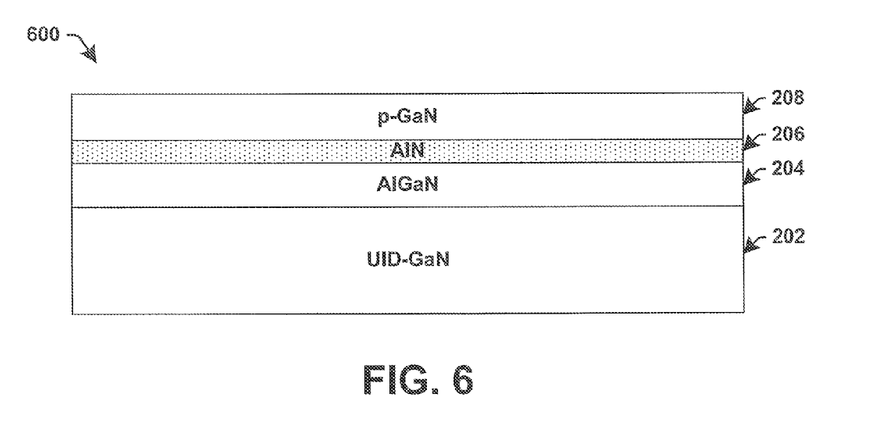
Figure 7:
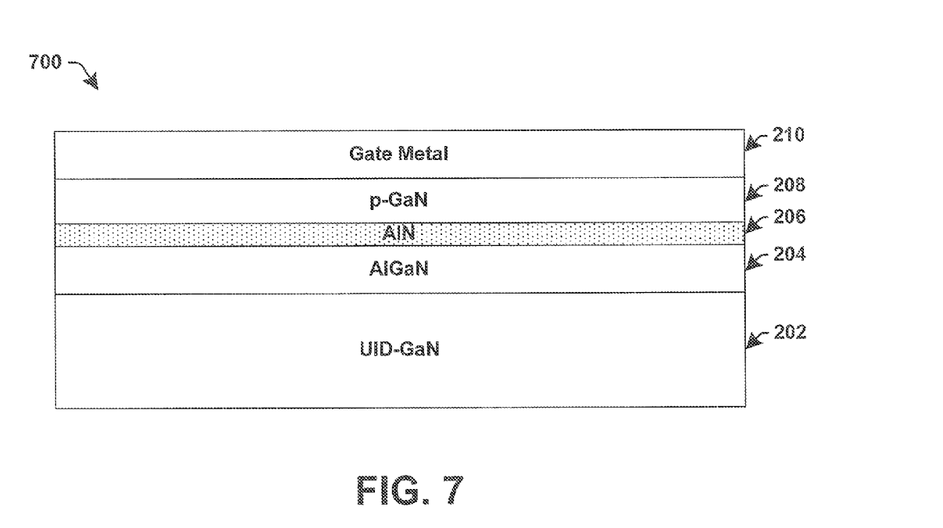

As illustrated in the cross sectional view 600 of FIG. 6, in some embodiments, a group III-V semiconductor material comprising a GaN layer 208 having a p-type doping is formed directly on top of the AlN etch stop layer 206. The AlN etch stop layer 206 has a bottom surface that continuously abuts the top surface of the GaN layer 208.

At 310 a gate material is formed onto the semiconductor material. In various embodiments the gate material may comprise a gate metal comprising titanium, aluminum or gold, for example. The gate material may be deposited onto the surface of the semiconductor material using sputtering or physical vapor deposition, for example. As illustrated in the cross sectional view 700 of FIG. 7, in some embodiments, a gate material comprising a gate metal 210 may be formed directly on top of the p-type GaN layer 208.

At 312 a patterned photoresist layer is formed on the gate metal material. The photoresist layer is formed on the gate material as a masking layer that is patterned to cover the underlying gate metal material in a gate region of the GaN device. The patterned photoresist layer may be formed by depositing photoresist (e.g., spin coating the substrate with the photoresist at a high spin speed) onto the gate material and then patterning the deposited photoresist by selective exposure to a light source (e.g., UV light) or electron beam and subsequent development of the exposed photoresist.

Figure 8:
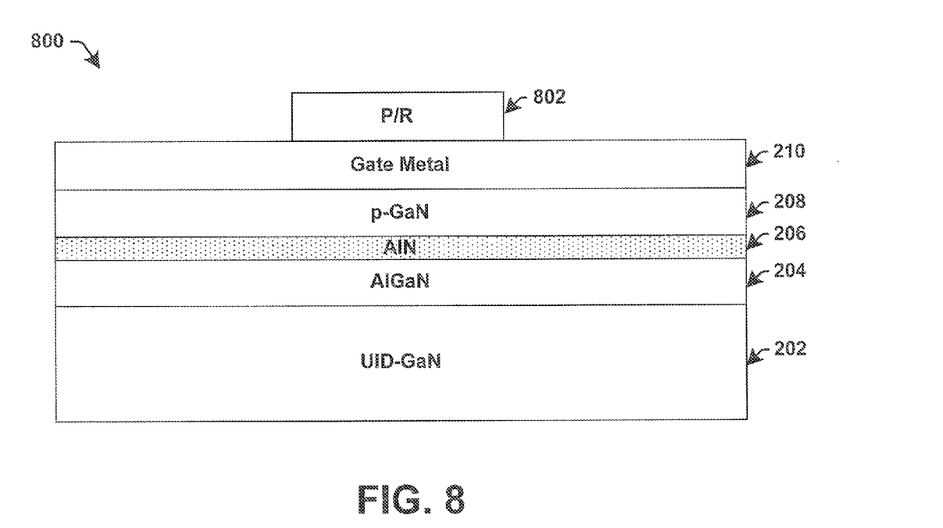

For example, as illustrated in the cross sectional view 800 of FIG. 8, in some embodiments, a patterned photoresist layer 802 is formed on top of the gate metal 210 to mask a region of the substrate that defines a gate structure of the GaN device, by covering the gate metal 210 in the gate region.

At 314 the substrate is selectively etched to define a gate by removing the gate material and the semiconductor material. In one embodiment, the substrate may be etched using an plasma etching (e.g., an inductively coupled plasma reactive ion etching in which high energy ions bombard the surface of the substrate to etch away the gate material and the semiconductor material), for example.

In some embodiments, substrate may be etched using an RIE plasma dry etch performed within a low pressure etching chamber. In some embodiments, the pressure within the etching chamber may be approximately 30 mTorr, for example. In some embodiments, the RIE etch utilizes an etching chemistry comprising various mixture ratios of Sulfur hexafluoride ($SF_6$) and Boron trichloride ($BCl_3$) gases. For example, in an exemplary embodiment, the mixture ratio is 20% $SF_6$ and 80% $BCl_3$. The RIE etch may be performed using an RF power of about 50 W to 300 W. A DC voltage bias is automatically tuned, by the RIE etching machine, to a value between +300V to −300V.

Figure 9A:
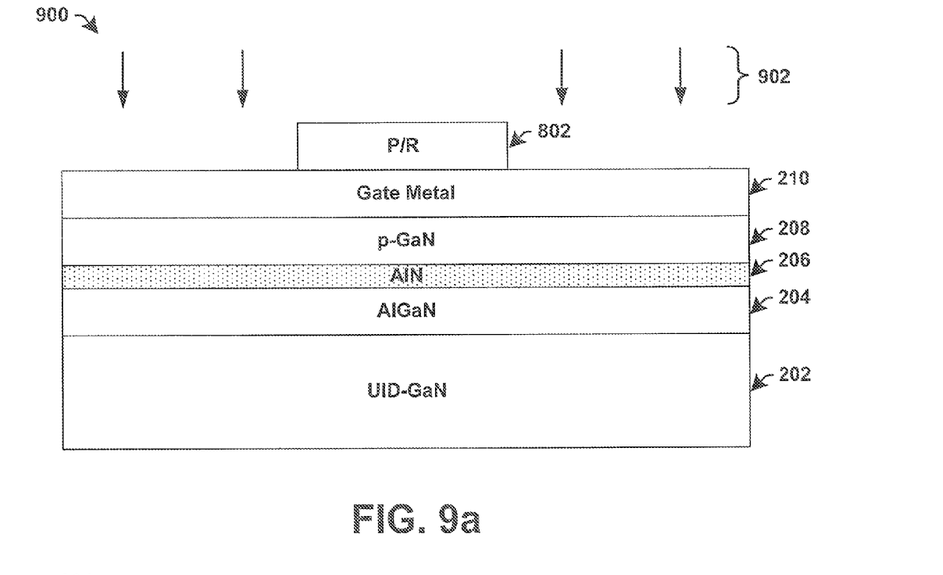

As illustrated in the cross sectional view 900 of FIG. 9a, in some embodiments, an RIE etching 902 removes the gate metal 210 and the p-type GaN layer 208 from exposed areas of the substrate (i.e., areas of the substrate not protected by the photoresist layer 802). The RIE etching 902 is hindered by the AlN etch stop layer 206.

Figure 9B:
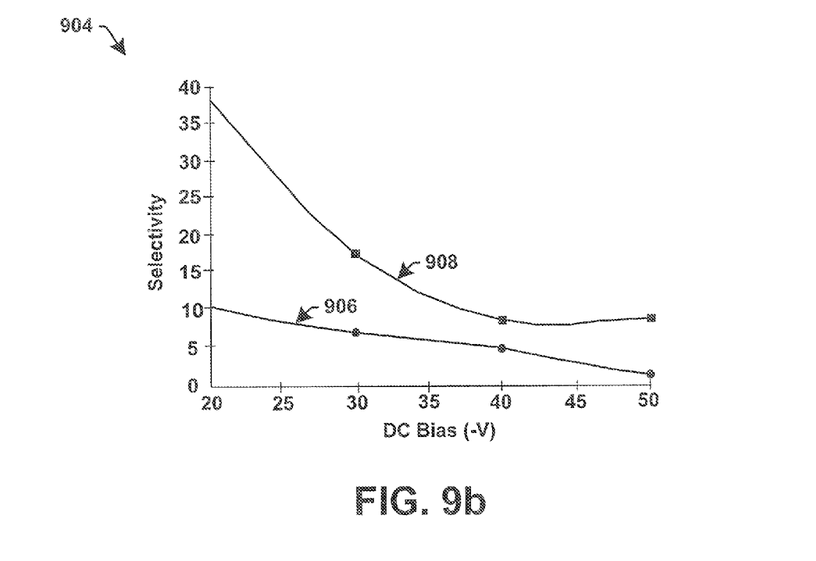
FIG. 9b is a graph illustrating the etching selectivity of GaN compared to both an AlN etch stop layer and an aluminum gallium nitride (AlGaN) layer.
Figure 10:
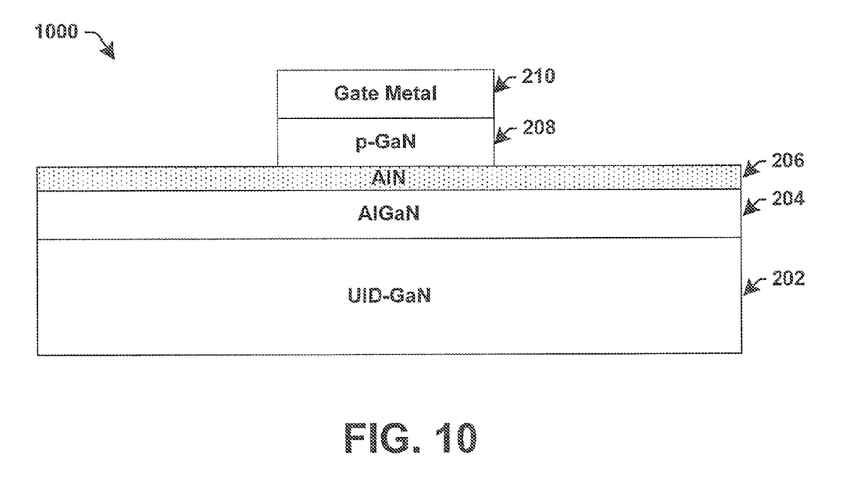

It will be appreciated that the etch stop layer provides for good etching selectivity that improves the gate definition over prior art methods (e.g., not having an etch stop layer). For example, FIG. 9b illustrates a graph 904 illustrating the etching selectivity of GaN compared to both an AlN etch stop layer and an AlGaN layer. The graph 904 shows the selectivity on the y-axis and the DC bias (e.g., corresponding to the ion bombardment energy) applied to the substrate during a RIE etching process on the x-axis.

Since etching selectivity is a ratio of etch rates, the etching selectivity of graph 904 defines a speed at which the GaN will etch compared to another material (e.g., AlN or AlGaN). A low etching selectivity between the GaN layer and an underlying layer makes process control difficult and results in severe damage to the underlying layer during gate definition. However, a high etching selectivity between the GaN layer and an underling layer improves process control and retards damage to the underlying layer during gate definition.

In particular, graph 904 illustrates a first trend line 906 showing the rate at which GaN etches versus the rate at which AlGaN etches. The line 906 illustrates that at a DC bias of −20V, the GaN etches at a rate that is approximately 10 times greater than that of AlGaN. Because the 2DEG concentration of a GaN semiconductor device is very sensitive to the AlGaN thickness, the relatively low etching selectivity of line 906 provides for insufficient etching process control.

Graph 904 illustrates a second trend line 908 showing the rate at which GaN etches versus the rate at which AlN etches. The line 908 illustrates that at a DC bias of −20V, the GaN etches at a rate that is approximately forty times greater than that of AlN. Accordingly, as illustrated in graph 904, under the same etching condition used to etch GaN layer, the AlN layer is etched less than the AlGaN layer when placed underneath the GaN layer. Therefore, placement of an AlN etch stop layer below the gate structure provides for nearly three times the etching selectivity over transistor structures not having the AlN layer, improving processing control ability. This allows for improved gate structure definition without damaging the underlying AlGaN electron supply layer.

At 316 the photoresist is removed. Removal of the photoresist results in a GaN device comprising a metal insulator semiconductor high electron mobility transistor (MIS-HEMT), with a stacked gate structure comprising a group III-V semiconductor material layer located on the AlN etch stop layer, as illustrated in cross sectional view 1000 of FIG. 10.

It will be appreciated that while reference is made throughout this document to exemplary structures in discussing aspects of methodologies described herein (e.g., the structure presented in FIGS. 4-10, while discussing the methodology set forth in FIG. 3), that those methodologies are not to be limited by the corresponding structures presented. Rather, the methodologies (and structures) are to be considered independent of one another and able to stand alone and be practiced without regard to any of the particular aspects depicted in the Figs. Additionally, layers described herein, can be formed in any suitable manner, such as with spin on, sputtering, growth and/or deposition techniques, etc.

Also, equivalent alterations and/or modifications may occur to those skilled in the art based upon a reading and/or understanding of the specification and annexed drawings. The disclosure herein includes all such modifications and alterations and is generally not intended to be limited thereby. For example, although the figures provided herein, are illustrated and described to have a particular doping type, it will be appreciated that alternative doping types may be utilized as will be appreciated by one of ordinary skill in the art.

In addition, while a particular feature or aspect may have been disclosed with respect to only one of several implementations, such feature or aspect may be combined with one or more other features and/or aspects of other implementations as may be desired. Furthermore, to the extent that the terms "includes", "having", "has", "with", and/or variants thereof are used herein, such terms are intended to be inclusive in meaning—like "comprising." Also, "exemplary" is merely meant to mean an example, rather than the best. It is also to be appreciated that features, layers and/or elements depicted herein are illustrated with particular dimensions and/or orientations relative to one another for purposes of simplicity and ease of understanding, and that the actual dimensions and/or orientations may differ substantially from that illustrated herein.

What is claimed is:

1. A gallium nitride (GaN) transistor device, comprising:
a gallium nitride (GaN) layer located on a substrate;
an electron supply layer located on top of the GaN layer, wherein the electron supply layer and the GaN layer share an interface that forms a hetero-junction therebetween;
a planar etch stop layer located above the electron supply layer, wherein the planar etch stop layer is configured to stop an etching process from etching the electron supply layer;
a source contact and a drain contact abutting the electron supply layer and the planar etch stop layer, where a bottom surface of the source contact, a bottom surface of the drain contact and a bottom surface of the planar etch stop layer are coplanar and contact a to surface of the electron supply layer;
a gate structure located on top of the planar etch stop layer, so that the planar etch stop layer extends laterally as a continuous layer below the gate structure so as to separate the electron supply layer from the gate structure; and
wherein the gate structure comprises a group III-V semiconductor material located on top of and in direct contact with the planar etch stop layer, and a gate metal layer located on top of and in direct contact with the group III-V semiconductor material.

2. The GaN transistor device of claim 1, wherein the planar etch stop layer comprises aluminum nitride (AlN).

3. The GaN transistor device of claim 2, wherein the planar etch stop layer has a thickness in a range from about 1 nm thickness to about 20 nm thickness.

4. The GaN transistor device of claim 1, wherein the planar etch stop layer comprises indium nitride (InN), aluminum oxide ($Al_2O_3$), or gallium oxide (GaO).

5. The GaN transistor device of claim 1, wherein a bottom surface of the planar etch stop layer abuts a top surface of the electron supply layer in a gate region of the GaN transistor device.

6. The GaN transistor device of claim 1, wherein the planar etch stop layer has a band gap that is larger than band gaps of the group III-V semiconductor material and the electron supply layer.

7. The GaN transistor device of claim 1, wherein the group III-V semiconductor material comprises a p-type doped gallium nitride (GaN).

8. The GaN transistor device of claim 1, wherein the group III-V semiconductor material comprises a p-type doped aluminum gallium nitride (AlGaN) or an indium gallium nitride (InGaN).

9. The GaN transistor device of claim 1, wherein the electron supply layer comprises aluminum gallium nitride (AlGaN).

10. A transistor device, comprising:
a substrate;
a gallium nitride (GaN) layer disposed over the substrate;
an electron supply layer disposed onto the GaN layer, wherein the electron supply layer has a larger bandgap than the GaN layer, so as to form a hetero-junction therebetween;
an aluminum nitride (AlN) etch stop layer disposed onto and in direct contact with the electron supply layer, wherein the AlN etch stop layer is configured to stop an etching process from etching the electron supply layer; and
a source contact and a drain contact abutting the electron supply layer and the AlN etch stop layer, wherein a bottom surface of the source contact, a bottom surface of the drain contact and a bottom surface of the AlN etch stop layer are coplanar and contact a to surface of the electron supply layer;
a gate structure disposed at a position abutting the AlN etch stop layer, wherein the gate structure comprises a group III-V semiconductor material located on to of and in direct contact with the AlN etch stop layer, and a gate metal layer located on top of and in direct contact with the group III-V semiconductor material, and
wherein the AlN etch stop layer has a larger bandgap than the electron supply layer and the gate structure.

11. The transistor device of claim 10, wherein the etch stop layer has a thickness in a range of between approximately 1 nm and approximately 20 nm.

12. The transistor device of claim 10, wherein the group III-V semiconductor material comprises gallium nitride (GaN), aluminum gallium nitride (AlGaN), or indium gallium nitride (InGaN).

13. The transistor device of claim 10,
wherein the electron supply layer has a first etching selectivity for etching the gallium nitride layer,
wherein the etch stop layer has a second etching selectivity for etching the gallium nitride layer that is greater than three times larger than the first etching selectivity.

14. A gallium nitride (GaN) transistor device, comprising:
a substrate;
a gallium nitride (GaN) layer disposed over the substrate;
a layer of aluminum gallium nitride (AlGaN) disposed onto and in direct contact with the GaN layer;
a layer of aluminum nitride (AlN) disposed onto and in direct contact with the layer of AlGaN, wherein the layer of AlN is configured to stop an etching process from etching the layer of AlGaN;
a source contact and a drain contact abutting the layer if AlGaN and the layer of AlN, wherein a bottom surface of the source contact, a bottom surface of the drain contact and a bottom surface of the layer of AlN are coplanar and contact a top surface of the layer of AlGaN;
a layer of doped gallium nitride (GaN) disposed onto and in direct contact with the layer of AlN; and
a layer of gate metal disposed onto and in direct contact with the layer of doped GaN.

15. The GaN transistor device of claim 1,
wherein the source contact and the drain contact abut sidewalls of the planar etch stop layer on opposite sides of the gate structure.

16. The GaN transistor device of claim 10,
wherein the source contact and the drain contact abut sidewalls of the AlN etch stop layer on opposite sides of the gate structure.

17. The GaN transistor device of claim 14, further comprising:
wherein the source contact and the drain contact abut sidewalls of the layer of AlN on opposite sides of the layer of gate metal.

* * * * *

UNITED STATES PATENT AND TRADEMARK OFFICE
CERTIFICATE OF CORRECTION

Page 1 of 1

| | |
|---|---|
| PATENT NO. | : 8,946,771 B2 |
| APPLICATION NO. | : 13/292487 |
| DATED | : February 3, 2015 |
| INVENTOR(S) | : Chih-Wen Hsiung et al. |

It is certified that error appears in the above-identified patent and that said Letters Patent is hereby corrected as shown below:

IN THE CLAIMS:

Column 8, Claim 1, Line 57 Please replace "...and contact a to surface of..."
with --...and contact a top surface of...--

Column 9, Claim 10, Line 44 Please replace "...and contact a to surface of..."
with --...and contact a top surface of...--

Column 9, Claim 10, Line 48 Please replace "...material located on to of and..."
with --...material located on top of and...--

Signed and Sealed this
Fifth Day of May, 2015

Michelle K. Lee
*Director of the United States Patent and Trademark Office*